United States Patent
Liu

(10) Patent No.: US 7,952,531 B2
(45) Date of Patent: May 31, 2011

(54) PLANAR CIRCULARLY POLARIZED ANTENNAS

(75) Inventor: Duixian Liu, Scarsdale, NY (US)

(73) Assignee: International Business Machines Corporation, Armonk, NY (US)

(*) Notice: Subject to any disclaimer, the term of this patent is extended or adjusted under 35 U.S.C. 154(b) by 68 days.

(21) Appl. No.: 12/031,282

(22) Filed: Feb. 14, 2008

(65) Prior Publication Data

US 2009/0015496 A1 Jan. 15, 2009

Related U.S. Application Data

(60) Provisional application No. 60/949,884, filed on Jul. 16, 2007, provisional application No. 60/949,685, filed on Jul. 13, 2007.

(51) Int. Cl.
*H01Q 11/12* (2006.01)
(52) U.S. Cl. .......................... 343/742; 343/867
(58) Field of Classification Search .................. 343/742, 343/741, 744, 745, 866, 867, 868, 700 MS
See application file for complete search history.

(56) References Cited

U.S. PATENT DOCUMENTS

| | | | |
|---|---|---|---|
| 5,872,545 A * | 2/1999 | Rammos | 343/770 |
| 6,693,599 B1 * | 2/2004 | Chia et al. | 343/741 |
| 6,798,384 B2 * | 9/2004 | Aikawa et al. | 343/700 MS |
| 6,906,672 B1 * | 6/2005 | Miller et al. | 343/744 |
| 2003/0201944 A1 * | 10/2003 | Aikawa et al. | 343/770 |
| 2007/0013599 A1 * | 1/2007 | Gaucher et al. | 343/795 |

FOREIGN PATENT DOCUMENTS

TW  451520  * 8/2001

OTHER PUBLICATIONS

R. Li et al., "Investigation of Circularly Polarized Loop Antennas with a Parasitic Element for Bandwidth Enhancement," IEEE Trans. Antennas Propagation, Dec. 2005, pp. 3930-3939, vol. 53, No. 12.
J. Grzyb et al., "Wideband Cavity-Backed Folded Dipole Superstrate Antenna for 60 GHz Applications," Proc. of the 2006 IEEE AP-S International Symp., 2006, pp. 3939-3942.
U.R. Pfeiffer et al., "A Chip-Scale Packaging Technology for 60-GHz Wireless Chipsets," IEEE Transactions on Microwave Theory and Techniques, Aug. 2006, pp. 3387-3397, vol. 54, No. 8.

* cited by examiner

*Primary Examiner* — HoangAnh T Le
(74) *Attorney, Agent, or Firm* — Anne V. Dougherty; Ryan, Mason & Lewis, LLP

(57) ABSTRACT

A planar circularly polarized antenna comprises at least one coplanar waveguide feed line and a plurality of driven loops electrically connected to the feed line, wherein the driven loops and the feed line are substantially coplanar. At least one of the plurality of driven loops may be of a size different from at least another one of the plurality of driven loops and at least one of the plurality of driven loops may have a resonant frequency different from at least another one of the plurality of driven loops.

21 Claims, 8 Drawing Sheets

100

200

300

400

500

800

900

1400

# PLANAR CIRCULARLY POLARIZED ANTENNAS

This application claims the benefit of U.S. Provisional Application No. 60/949,884, filed Jul. 16, 2007, and U.S. Provisional Application No. 60/949,685, filed Jul. 13, 2007, the disclosures of which are incorporated by reference herein.

FIELD OF THE INVENTION

The present invention relates generally to antenna designs. Specifically, the present invention is related to planar circularly polarized (CP) antenna designs suitable for millimeter wave (mmWave) packaging.

BACKGROUND OF THE INVENTION

In a wireless network, connectivity and communication between devices is achieved through antennas attached to receivers or transmitters in order to radiate the desired signals to or from other elements of the network. In radio communication systems, such as millimeter-wave radios, discrete components are usually assembled with low integration levels. These systems are often assembled using expensive and bulky waveguides and package-level or board-level microstrip structures to interconnect semiconductors and their required transmitter or receiver antennas.

With recent progress in semiconductor technology and packaging engineering, the dimensions of these radio communication systems have become smaller and integration of antennas with their radio frequency (RF) front-end circuits has become more desirable. For applications such as wireless universal serial bus (USB), the operating distance is limited to about a meter; a single antenna with about 7 dBi at 60 GHz will provide the necessary antenna gains. However, these devices typically operate in indoor environments. As a result, multi-path fading due to multiple reflections and diffractions deteriorates the radio system performance. Numerous studies indicate circularly polarized (CP) antennas can be used to mitigate the multi-path effect on the system performance.

As is well-known to one having skill in the art, packagable CP antennas require three major components: a radiator that can radiate circularly polarized electromagnetic waves (either left- or right-handed), a feeding network for impedance matching and interfacing with semiconductor chips, and a relatively small cavity for use in the packaging process and reducing electromagnetic interference (EMI) to active circuits.

For example, R. Li et al., "Investigation of Circularly Polarized Loop Antennas With a Parasitic Element for Bandwidth Enhancement," *IEEE Transactions on Antennas and Propagation*, vol. 54, no. 12, pp. 3930-3939, December 2005, the disclosure of which is incorporated by reference herein, discloses series- and parallel-fed dual rhombic-loop antennas with and without a parasitic dual rhombic loop.

SUMMARY OF THE INVENTION

In an illustrative embodiment, a planar circularly polarized antenna comprises at least one coplanar waveguide feed line and a plurality of driven loops electrically connected to the feed line, wherein the driven loops and the feed line are substantially coplanar.

In another illustrative embodiment, a method of forming a planar circularly polarized antenna comprises the steps of forming a plurality of driven loops on a first surface of the substrate and forming at least one coplanar waveguide feed line on the first surface of a substrate. The driven loops are electrically connected to the feed line and the driven loops and the feed line are substantially coplanar.

Exemplary embodiments of the present invention may advantageously permit the distance between the antenna element and the back ground plane to be minimized without loss of axial ratio (AR) bandwidth. In an illustrative embodiment, the distance between the antenna structure and the back ground plane is only one-tenth of a wavelength, much smaller than the one-quarter of a wavelength required by conventional circularly polarized antenna structures.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

While reference may be made herein to certain device components, it is to be understood that the present invention is not limited to these or any particular device components or arrangements thereof. Rather, the invention is more generally applicable to techniques for planar circularly polarized antennas. Although the inventive techniques are described herein with reference to an antenna with double rhombic driven loops, it should be noted that the inventive techniques may be adapted for use with any number, size and/or shape of driven elements, in a manner known to one having skill in the art. For example, and without limitation, the inventive techniques described herein may be used with any desired combination of square, rectangular, rhombic, elliptical, or circular loops or other driven elements, such as dipole antennas and/or PIFAs (planar inverted-F antennas). Likewise, the inventive techniques may be used with antennas having any number, size and/or shape of parasitic loops and/or other parasitic elements.

Figure 1:
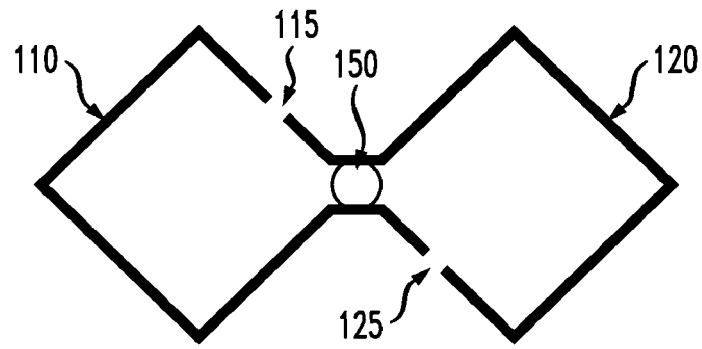
FIG. 1 shows an exemplary parallel-fed dual rhombic-loop CP antenna without a parasitic dual rhombic loop, according to the prior art.

FIG. 1 shows a conventional parallel-fed dual rhombic-loop CP antenna without a parasitic dual rhombic loop, similar to that discussed in Li et al. Specifically, antenna 100 comprises two rhombic driven loops 110 and 120, which are electrically connected in parallel to feed line 150, which is perpendicular to the antenna plane. Driven loops 110 and 120 are of the same size and shape. Each of driven loops 110 and 120 has a discontinuity, or gap (115 and 125, respectively), which causes the loop to radiate circularly polarized waves rather than linearly polarized waves.

Figure 2:
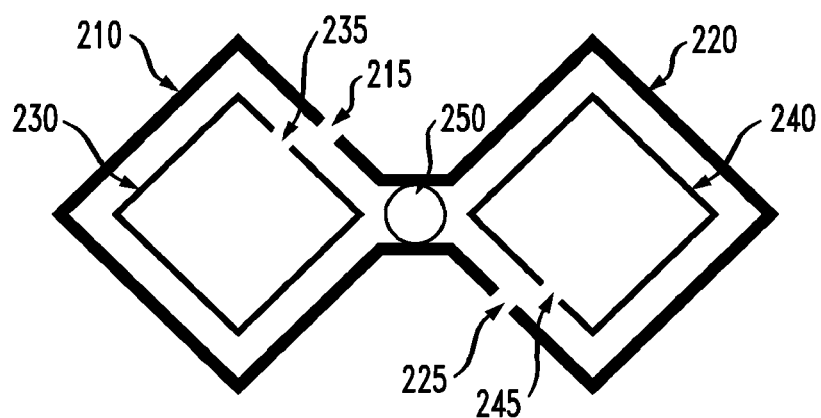
FIG. 2 shows an exemplary parallel-fed dual rhombic-loop CP antenna with a parasitic dual rhombic loop, according to the prior art.

FIG. 2 shows a conventional parallel-fed dual rhombic-loop CP antenna with a parasitic dual rhombic loop, also discussed in Li et al. Like antenna 100 shown in FIG. 1, antenna 200 also comprises two rhombic driven loops 210 and 220, which are electrically connected in parallel to feed line 250, which is perpendicular to the antenna plane and hence shown as a cross-section. Here again, driven loops 210 and 220 are of the same size and shape and each of driven loops 210 and 220 has a gap 215 and 225, respectively. In this embodiment, however, each of driven loops 210 and 220 has a parasitic loop (230 and 240, respectively) comprising a concentric rhombic loop located within the respective driven loop. Unlike driven loops 210 and 220, parasitic loops 230 and 240 are not electrically connected to feed line 250. Parasitic loops 230 and 240 contain gaps 225 and 235, respectively, which may be similar in form and in function to gaps 215 and 225 contained in driven loops 210 and 220.

Microstrip patch related CP antennas, such as antennas 100 and 200 heretofore described, do not have the required impedance and axial ratio (AR) bandwidth. Moreover, the feed network, typically microstrip lines, is usually not suitable for mmWave applications or difficult for flip-mounting. Wire bonds between semiconductor chips and antennas are usually avoided to minimize insertion loss and inductance for impedance matching. Many cavity-backed planar CP slot or printed antennas including spirals require the distance between the antenna element and the back ground plane to be a quarter-wavelength (about 1250 μm at 60 GHz) or larger. This distance is too large for mmWave packaging applications, which typically require distances of less than 500 μm.

For example, antennas 100 and 200 have adequate performance if the back ground plane is at least a quarter wavelength away from the antenna structure; however, this distance separation is too large for mmWave packaging applications. Moreover, antenna 100 and 200 have a wide axial ratio (AR) bandwidth if the distance between the back ground plane and the antenna structure is at least a quarter of a wavelength. However, this distance is usually less than an eighth of a wavelength in package applications. As a result, the antenna bandwidth will be narrow. Furthermore, because antennas 100 and 200 have driven loops of the same size, these loops resonate on the same frequency. Thus, the bandwidth improvement is limited even if parasitic loops are used, as in antenna 200. It should be noted that although the addition of parasitic loops 230 and 240 in antenna 200 results in increased bandwidth relative to antenna 100, the simpler configuration of antenna 100 may be preferable in instances where the bandwidth requirement is not critical.

Moreover, most conventional antennas require microstrip feed lines, which likewise renders these antennas unsuitable for mmWave packaging. Furthermore, many of these antenna designs require a feed network that is perpendicular to the antenna radiating elements, which requires the use of vias for the feed networks. However, it is desirable in the manufacturing process to avoid vias. For example, antennas 100 and 200 both require feed line 150 and 250, respectively, to be perpendicular to the antenna plane, which renders a coplanar feed structure impossible. Thus, known CP antenna designs fail to satisfy at least one of the antenna performance, manufacture process, interconnection, and packaging requirements associated with mmWave packaging applications.

Figure 3:
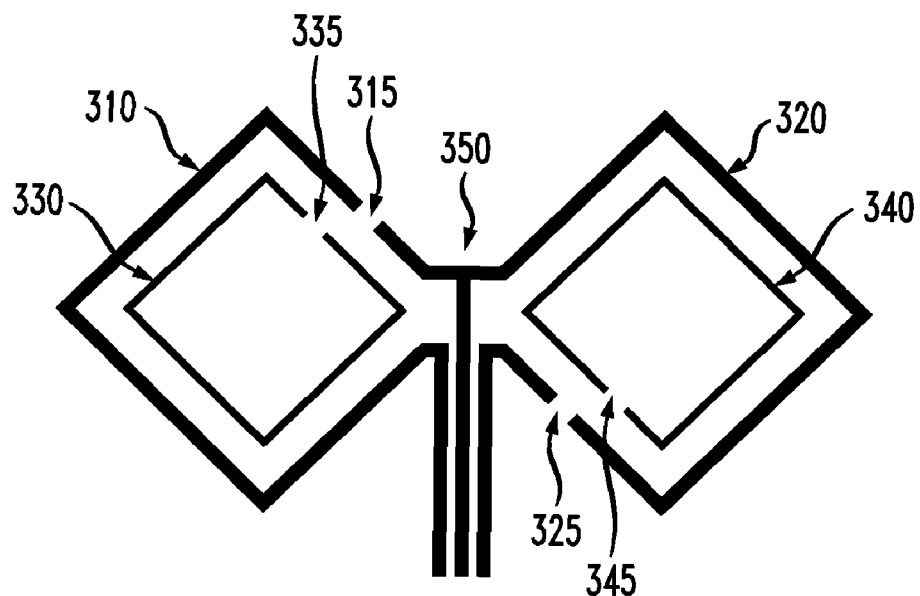
FIG. 3 shows an exemplary planar CP antenna with a coplanar waveguide (CPW) feed line, according to an aspect of the invention.

FIG. 3 shows exemplary planar CP antenna 300 according to an aspect of the invention. Antenna 300 comprises two rhombic driven loops 310 and 320 and respective parasitic loops 330 and 340, as well as gaps 315, 325, 335 and 345. Unlike conventional antennas 100 and 200, however, feed line 350 is a coplanar waveguide (CPW) feed line, which is within the antenna plane, rather than perpendicular thereto. The use of a CPW feed line advantageously permits the antenna to be manufactured without the use of vias.

It should be noted that feed line 350 is electrically connected in parallel to driven loops 310 and 320 but is not electrically connected to parasitic loops 330 and 340. In a preferred embodiment of parallel-fed antenna 300, both driven loops 310 and 320 have a loop length of approximately 1.1 wavelengths.

Figure 4:
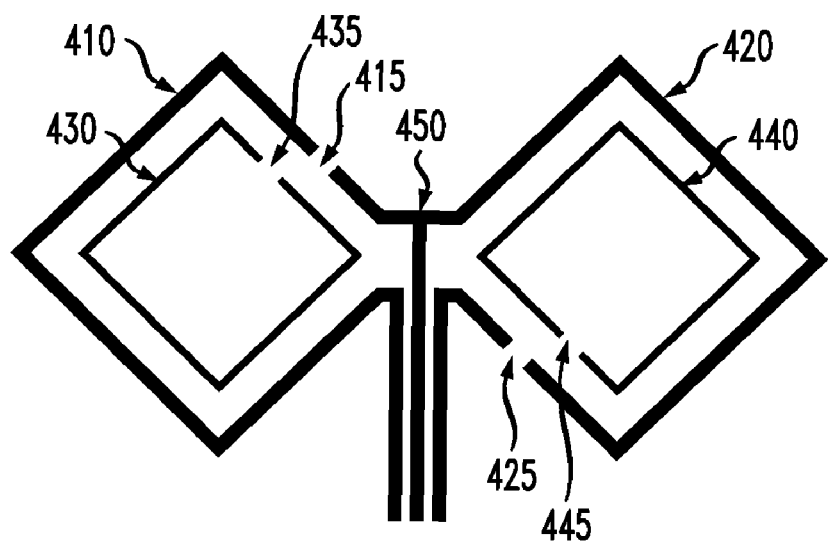
FIG. 4 shows an exemplary planar CP antenna with asymmetric driven loops, according to an aspect of the invention.

FIG. 4 shows exemplary planar CP antenna 400 according to another aspect of the invention. Like antenna 300, antenna 400 comprises two rhombic driven loops 410 and 420 and respective parasitic loops 430 and 440, as well as gaps 415, 425, 435 and 445. CPW feed line 450 is electrically connected in parallel to driven loops 410 and 420 but is not electrically connected to parasitic loops 430 and 440.

However, antenna 400 comprises asymmetrical loops. Specifically, driven loop 420 is larger than driven loop 410, thus causing driven loop 420 to have a resonant frequency lower than the resonant frequency of driven loop 410. In a preferred embodiment of antenna 400, driven loop 410 may have a loop length less than 1.1 wavelengths and driven loop 420 may have a loop length greater than 1.1 wavelengths.

Of course, driven loop 410 could also be made larger than driven loop 420, causing driven loop 420 to have a resonant frequency higher than the resonant frequency of driven loop 410. In either case, parasitic loop 430 extends the bandwidth around the resonant frequency of driven loop 410, and parasitic loop 440 extends the bandwidth around the resonant frequency of driven loop 420. Accordingly, antenna 400 will have significantly greater bandwidth than antenna 100, antenna 200, or even antenna 300.

Figure 5:
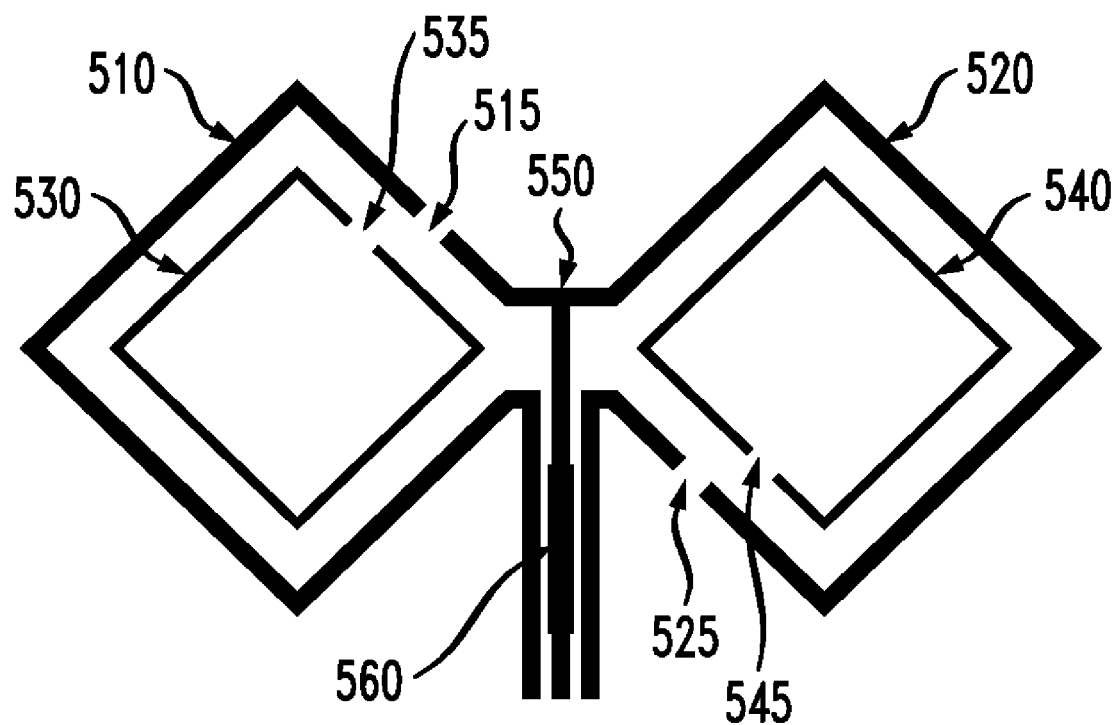
FIG. 5 shows an exemplary planar CP antenna with a transformer, according to an aspect of the invention.

FIG. 5 shows an exemplary planar CP antenna with a transformer, according to an aspect of the invention. Like antennas 300 and 400, antenna 500 comprises two rhombic driven loops 510 and 520 and respective parasitic loops 530 and 540, as well as gaps 515, 525, 535 and 545. CPW feed line 550 is electrically connected in parallel to driven loops 510 and 520 but is not electrically connected to parasitic loops 530 and 540. In this embodiment, however, CPW feed line 550 further comprises a transformer operative match the antenna impedance to a required reference impedance, such as 50 ohms.

Figure 6:
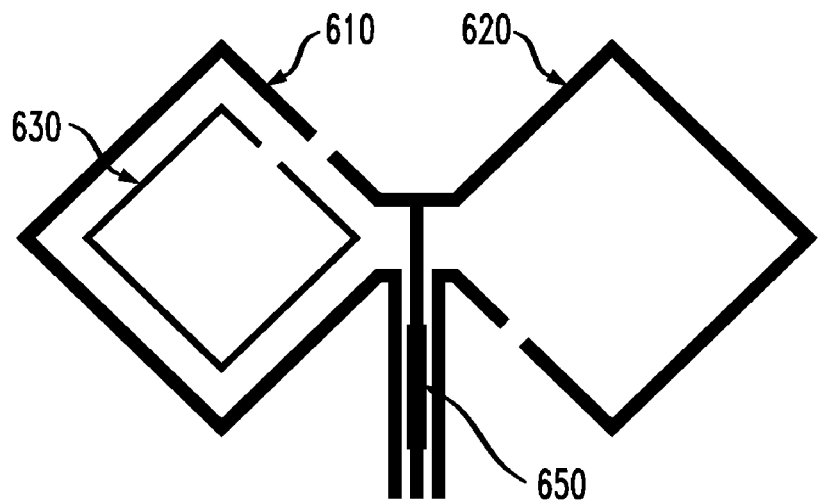
FIG. 6 shows an exemplary planar CP antenna with a parasitic loop in the left loop, according to an aspect of the invention.
Figure 7:
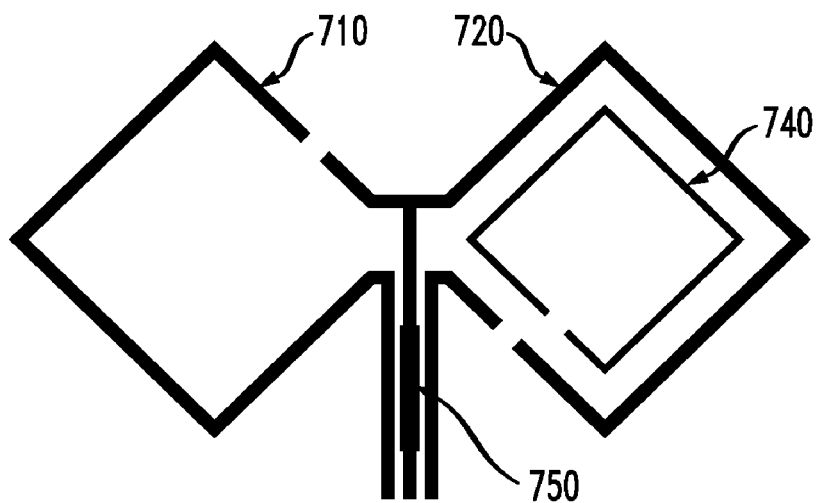
FIG. 7 shows an exemplary planar CP antenna with a parasitic loop in the right loop, according to an aspect of the invention.

It should be noted that, depending on the criticality of the bandwidth requirement is not too critical, it may be desirable to only include parasitic loops in a subset of the driven loops. For example, one parasitic element may be used in a dual-loop implementation. FIG. 6 shows antenna 600, similar to antenna 500 except driven loop 610 contains parasitic loop 630 and driven loop 620 does not contain a parasitic loop. FIG. 7 shows antenna 700, similar to antenna 500 except driven loop 710 does not contain a parasitic loop but driven loop 720 contains parasitic loop 740. It should be noted that these embodiments may result in the bandwidth being extended around the resonant frequency of only a driven loop containing a parasitic loop, thus resulting in asymmetrical bandwidth.

Figure 8:
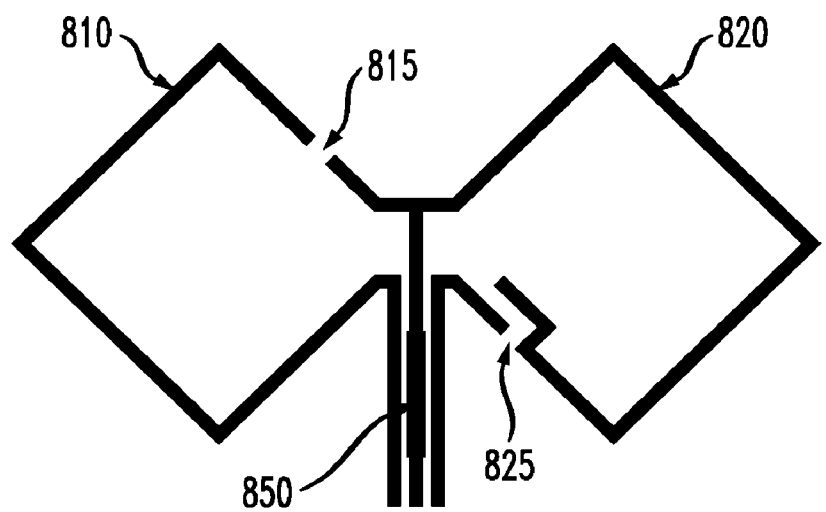
FIG. 8 shows an exemplary planar CP antenna with a strong capacitive coupling, according to an aspect of the invention.
Figure 9:
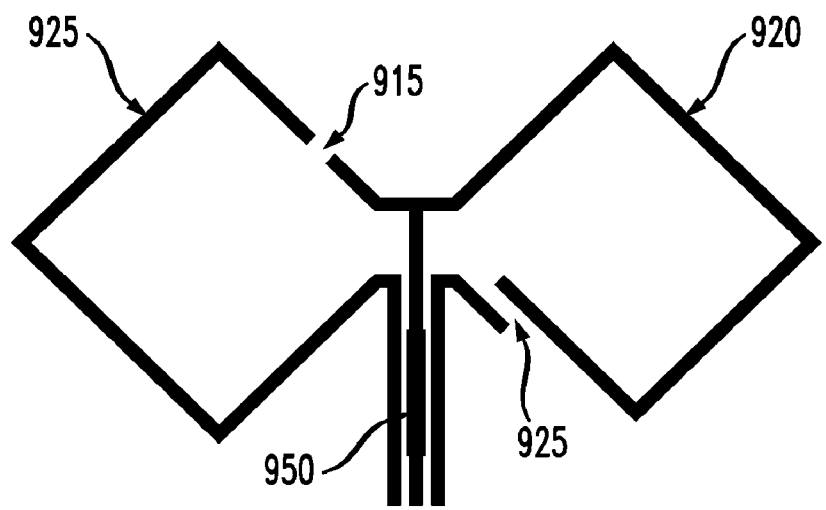
FIG. 9 shows an exemplary planar CP antenna with a strong capacitive coupling, according to an aspect of the invention.

A further advantageous embodiment of the invention includes reducing the loop size (and hence the antenna size) by increasing the capacitive coupling. In a preferred embodiment, this may be done by configuring a gap in a driven loop to include some overlap. Exemplary embodiments of this are shown in FIG. 8 and FIG. 9, with respect to driven loops 820 and 920 containing respective gaps 825 and 925. It should be noted that, in an embodiment which includes asymmetric loops, such as discussed above with reference to FIG. 4, it may be particularly desirable to reduce the loop size for the driven loop with a lower resonant frequency.

Figure 10:
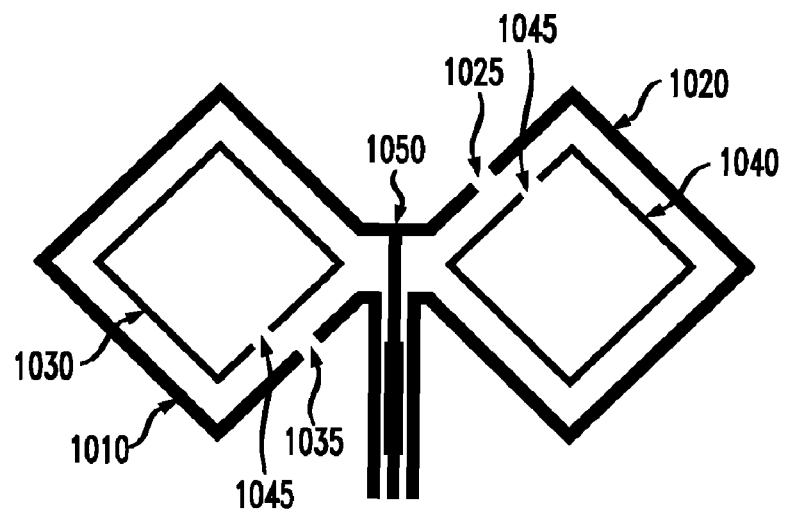
FIG. 10 shows an exemplary planar CP antenna with reversed polarization, according to an aspect of the invention.

Although the embodiments illustrated thus far are right-handed in orientation, the inventive techniques described herein may also be used with respect to a left-handed antenna. Particularly, a right-handed antenna may be converted into a left-handed antenna merely by performing a conceptual mirroring of the original design along the center line of the CPW feed line. Such a mirroring operation may be performed either during the design phase or, once the antenna has been built, by altering the gap positions using radio-frequency switches such as, for example, micro-electro-mechanical systems (MEMS), opto-electronic switches, and/or positive intrinsic negative (PIN) diodes, as known to one having skill in the art. For example, FIG. 10 shows antenna 1000, which is a left-handed version of antenna 500 shown in FIG. 5. Like antenna 500 shown in FIG. 5, antenna 1000 comprises two rhombic driven loops 1010 and 1020 and respective parasitic loops 1030 and 1040. Feed line 1050 is electrically connected in parallel to driven loops 1010 and 1020 but is not electrically connected to parasitic loops 1030 and 1040. However, note that the positioning of gaps 1015, 1025, 1035 and 1045 on respective loops 1010, 1020, 1030 and 1040 of antenna 1000 shown in FIG. 10 is opposite that of gaps 515, 525, 535 and 545 on respective loops 510, 520, 530 and 540 of antenna 500 shown in FIG. 5.

Figure 11:
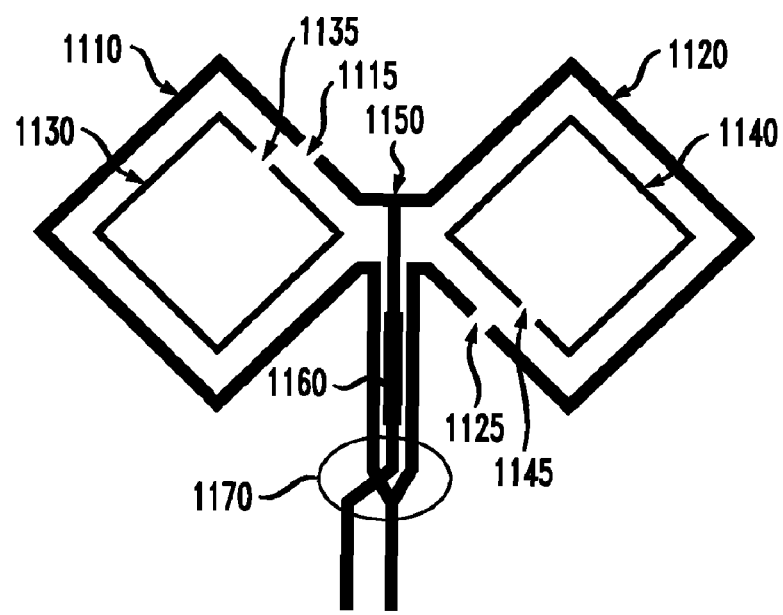
FIG. 11 shows an exemplary planar CP antenna with a balun, according to an aspect of the invention.

FIG. 11 shows antenna 1100, which allows the use of a differential feed, here a coplanar strips (CPS) feed, through the addition of wideband CPW-to-CPS balun 1170 to feedline 1150. In a preferred embodiment, the impedance on feedline 1150 is first changed from 50 ohms to 100 ohms through a quarter wavelength transformer 1160, and then wideband balun 1170 is applied. Antenna 1100 comprises two rhombic driven loops 1110 and 1120 and respective parasitic loops 1130 and 1140. Feed line 1150 is electrically connected in parallel to driven loops 1110 and 1120 but is not electrically connected to parasitic loops 1130 and 1140.

Figure 12:
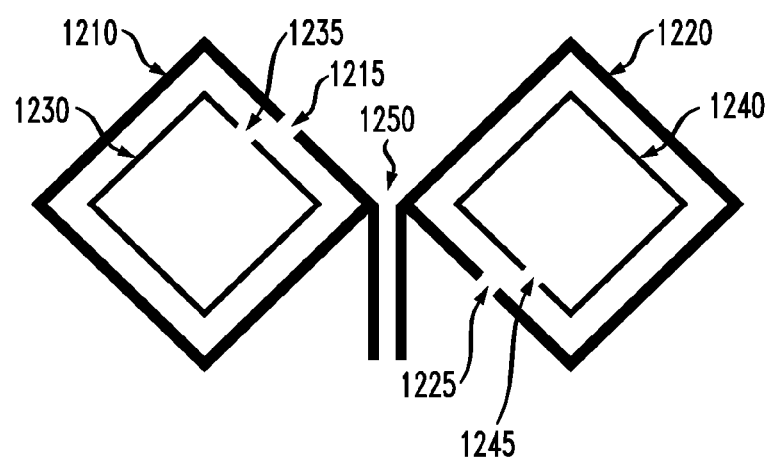
FIG. 12 shows an exemplary planar series-fed CP antenna, according to an aspect of the invention.

FIG. 12 shows antenna 1200, which implements inventive techniques in a series-fed (or differentially-fed) antenna. Specifically, like antenna 300, antenna 1200 comprises two rhombic driven loops 1210 and 1220 and respective parasitic loops 1230 and 1240, as well as gaps 1215, 1225, 1235 and 1245. CPS feed line 1250 is electrically connected in series, rather than in parallel, to driven loops 1210 and 1220 but is not electrically connected to parasitic loops 1230 and 1240. In a symmetrical embodiment of series-fed antenna 1200, both driven loops 1210 and 1220 have a loop length of approximately 1.4 wavelengths. In an asymmetrical embodiment of antenna 1200, driven loop 1210 may have a loop length less than 1.4 wavelengths and driven loop 1220 may have a loop length greater than 1.4 wavelengths, or vice versa.

Figure 13A:
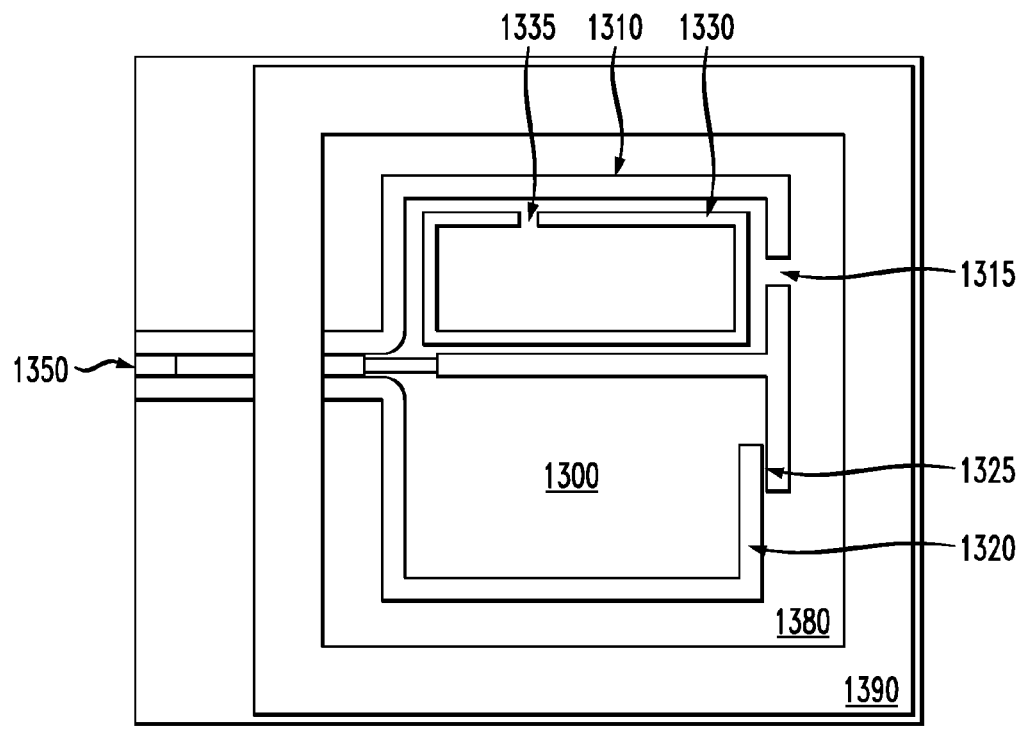
FIG. 13A shows a top view of a planar CP antenna in a cavity backed package, according to an aspect of the invention.
Figure 13B:
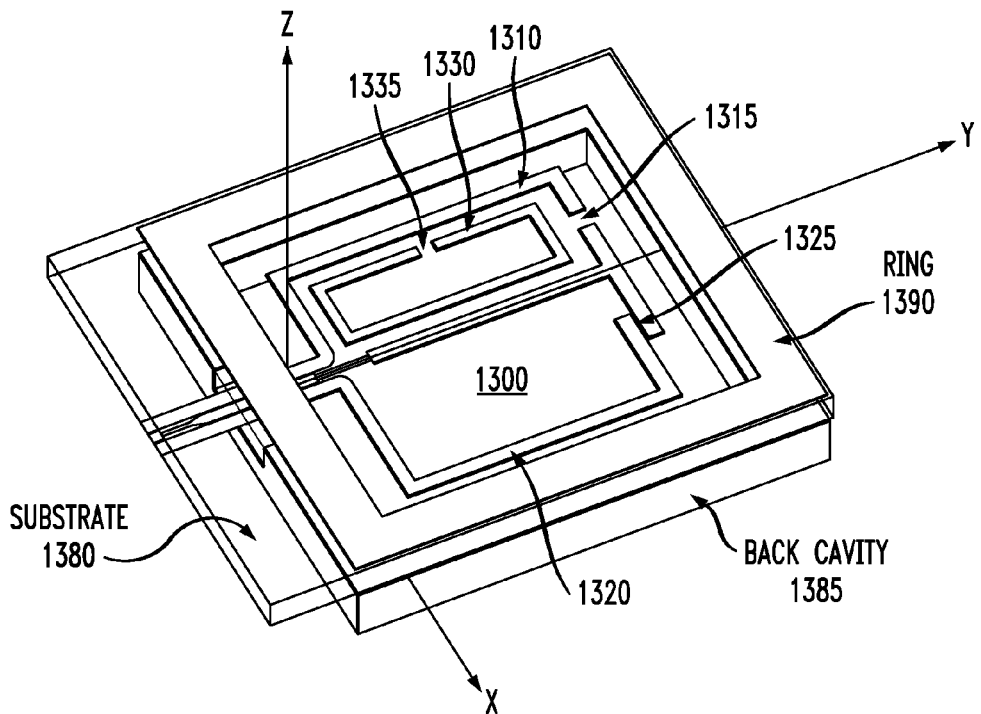
FIG. 13B shows a side view of a planar CP antenna in a cavity backed package, according to an aspect of the invention.

FIGS. 13A and 13B are respective top and side views of a cavity-backed package comprising antenna 1300. Antenna 1300 is formed on a lower surface of substrate 1380, which in turn is disposed above a metal frame 1385 comprising a cavity. In a preferred embodiment, the cavity walls have a thickness of approximately 0.5 mm and define a cavity with dimensions of approximately 3.849 mm along the X-axis, approximately 3.890 mm along the Y-axis, and approximately 0.5 mm along the Z-axis. In a preferred embodiment wherein the substrate is comprised of fused silica, it may desirable to form the cavity walls using a nickel-cobalt ferrous alloy, such as KOVAR (trademark of Carpenter Technology Corporation), because of its superior thermal expansion characteristic (3.7 ppm/° C.), which is matched closely to that of fused silica (0.55 ppm/° C.).

Substrate 1380 is preferably comprised of fused silica, which has a very low loss tangent (e.g., below 0.001 at 60 GHz) and a relatively low dielectric constant of 3.8. However, any substrate may be used in conjunction with inventive techniques, although one having skill in the art will recognize that a low-loss substrate is preferable. Moreover, in a preferred embodiment, the substrate will have a thickness of approximately 0.3 mm.

Antenna 1300 comprises two rectangular directed loops, 1310 and 1320, which are electrically connected to CPW feed line 1350. Directed loops 1310 and 1320 include respective gaps 1315 and 1325. It should be noted that gap 1325 comprises a capacitive coupling, whereas gap 1315 does not. Accordingly, gap 1315 has only a weak coupling. However, directed loop 1310 contains parasitic loop 1330, whereas directed loop 1320 does not. Moreover, directed loop 1320 is of a larger size, and hence has a lower resonant frequency, than directed loop 1330.

Metal ring 1390 is formed on an upper surface of low-loss substrate 1380 and may be used to suppress the surface waves of the substrate and thereby control the radiation patterns. In a preferred embodiment, the ring has a width of approximately 0.5 mm on both the top and the bottom; however, rings of other dimensions may be utilized in conjunction with the techniques herein described. For example, it may be desirable to utilize a ring with a non-uniform width. In a preferred embodiment wherein the substrate is comprised of fused silica, it may desirable to form the ring from a nickel-cobalt ferrous alloy, such as KOVAR (trademark of Carpenter Technology Corporation), because of its superior thermal expansion characteristic (3.7 ppm/° C.), which is matched closely to that of fused silica (0.55 ppm/° C.).

Figure 14:
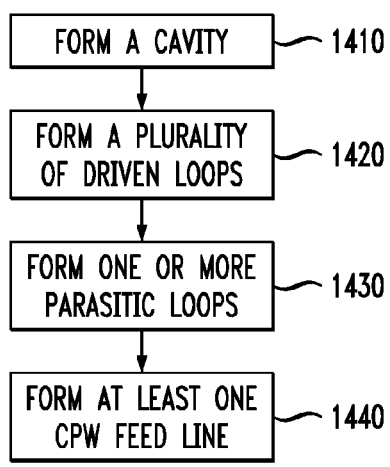
FIG. 14 is a simplified flow diagram showing an exemplary method for forming a planar CP antenna, according to an aspect of the invention.

FIG. 14 is a flowchart illustrating an exemplary method 1400 for forming a planar circularly polarized antenna, according to an embodiment of the present invention. Method 1400 begins with step 1410, which comprises the definition of a cavity on a first surface of a substrate, preferably the bottom side of a low-loss substrate. As indicated above, the substrate is preferably comprised of fused silica, which has a very low loss tangent (e.g., below 0.001 at 60 GHz) and a relatively low dielectric constant of 3.8. However, any substrate may be used in conjunction with inventive techniques, although one having skill in the art will recognize that a low-loss substrate is preferable. Moreover, in a preferred embodiment, the substrate will have a thickness of approximately 0.3 mm.

The size of the cavity defines the antenna size. In a preferred embodiment, the cavity walls are formed of a conductive metal with a thickness of approximately 0.5 mm and define a cavity with dimensions of approximately 3.849 mm along the X-axis, approximately 3.890 mm along the Y-axis, and approximately 0.5 mm along the Z-axis. In a preferred embodiment wherein the substrate is comprised of fused silica, it may desirable to form the cavity walls from a nickel-cobalt ferrous alloy, such as KOVAR (trademark of Carpenter Technology Corporation), because of its superior thermal expansion characteristic (3.7 ppm/° C.), which is matched closely to that of fused silica (0.55 ppm/° C.).

This step may also comprise forming a metal ring on a second surface of the substrate. In a preferred embodiment, the ring has a width of approximately 0.5 mm on both the top and the bottom; however, rings of other dimensions may be utilized in conjunction with the techniques herein described. For example, it may be desirable to utilize a ring with a non-uniform width. In a preferred embodiment wherein the substrate is comprised of fused silica, it may desirable to form the ring from a nickel-cobalt ferrous alloy, such as KOVAR (trademark of Carpenter Technology Corporation), because of its superior thermal expansion characteristic (3.7 ppm/° C.), which is matched closely to that of fused silica (0.55 ppm/° C.).

Preferably, this ring is chemically etched on the top side of a substrate. It should be noted that the ring may be formed using an alternative process, such as, for example, photolithography, a thin-film resolution metal patterning process, a high-resolution gold deposition process, or printing using electrically conductive ink. As noted above, the metal ring may be used to suppress the surface waves of the substrate and thereby control the radiation patterns.

Step 1420 comprises forming a plurality of driven loops, electrically connected to the feed line, on the first surface of the substrate. As noted above, these driven loops preferably include gaps and may be either symmetrical (with the same resonant frequency) or asymmetrical (with different resonant frequencies), as discussed above. Preferably, these loops are etched on the bottom side of a low-loss substrate. It should be noted that the loops may be formed using an alternative process, such as, for example, photolithography, a thin-film resolution metal patterning process, a high-resolution gold deposition process, or printing using electrically conductive ink.

Step 1430 is an optional step wherein one or more parasitic loops may be formed on the first surface of the substrate. These parasitic loops preferably include gaps. Preferably, these loops are chemically etched on the bottom side of a low-loss substrate. It should be noted that the loops may be formed using an alternative process, such as, for example, a thin-film resolution metal patterning process, a high-resolution gold deposition process, or printing using electrically conductive ink.

Step 1440 comprises forming at least one coplanar waveguide (CPW) feed line on a first surface of a substrate. Preferably, this CPW feed line is chemically etched on the bottom side of a low-loss substrate. It should be noted that the CPW feed line may be formed using an alternative process, such as, for example, photolithography, a thin-film resolution metal patterning process, a high-resolution gold deposition process, or printing using electrically conductive ink. Moreover, the CPW feed line may optionally comprise other elements including, but not limited to, the transformers and baluns heretofore described.

Any packaging technique known in the art may be used instead of or in addition to the cavity-based package heretofore described. Such techniques include, without limitation, monolithic-microwave integrated-circuit (MMIC) packaging; microwave integrated-circuit (MIC) packaging; chip-scale packaging (CSP), plastic ball grid arrays (PBGAs); direct-chip-attach (DCA) packaging; low-temperature co-fired ceramic (LTCC) packaging; and/or direct surface mountable land-grid array (LGA) packaging.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A planar circularly polarized antenna comprising:
   at least one coplanar waveguide feed line; and
   a plurality of driven loops electrically connected to the feed line;
   wherein the driven loops are substantially coplanar with one another;
   wherein the feed line is substantially coplanar with the plurality of driven loops;
   wherein the antenna is circularly polarized; and
   wherein the driven loops are electrically conductive.

2. The antenna of claim 1, further comprising at least one parasitic loop contained within at least one of the plurality of driven loops, wherein the at least one parasitic loop is not electrically connected to the feed line.

3. The antenna of claim 2, wherein each of the plurality of driven loops contains at least one parasitic loop.

4. The antenna of claim 2, wherein each of a subset of the plurality of driven loops contains at least one parasitic loop.

5. The antenna of claim 1, wherein each of the plurality of driven loops is of a given size.

6. The antenna of claim 1, wherein at least one of the plurality of driven loops is of a size different from at least another one of the plurality of driven loops.

7. The antenna of claim 1, wherein at least one of the plurality of driven loops has a resonant frequency different from at least another one of the plurality of driven loops.

8. The antenna of claim 1, further comprising at least one impedance transformer electrically connected to the feed line.

9. The antenna of claim 1, wherein at least one of the plurality of driven loops comprises at least one capacitive coupling.

10. The antenna of claim 1, further comprising at least one balun electrically connected to the feed line.

11. The antenna of claim 10, wherein the at least one balun is operative to convert a coplanar waveguide feed to a coplanar stripline feed.

12. The antenna of claim 1, wherein the driven loops are electrically connected to the feed line in parallel.

13. The antenna of claim 1, wherein the driven loops are electrically connected to the feed line in series.

14. The antenna of claim 1, wherein the antenna is formed on a first surface of a substrate.

15. The antenna of claim 14, wherein at least one metal cavity is formed on the substrate.

16. The antenna of claim 14, wherein at least one metal ring is formed on a second surface of the substrate.

17. A method of forming a planar circularly polarized antenna, comprising the steps of:
- forming a plurality of driven loops on a first surface of a substrate; and
- forming at least one coplanar waveguide feed line on the first surface of the substrate;
- wherein the plurality of driven loops are electrically connected to the feed line;
- wherein the driven loops are substantially coplanar with one another; and
- wherein the feed line is substantially coplanar with the plurality of driven loops;
- wherein the antenna is circularly polarized; and
- wherein the driven loops are electrically conductive.

18. The method of claim 17, further comprising the step of forming at least one metal cavity on the substrate.

19. The method of claim 17, further comprising the step of forming at least one metal ring on a second surface of the substrate.

20. The method of claim 17, wherein at least one of the plurality of driven loops is of a size different from at least another one of the plurality of driven loops.

21. The method of claim 17, wherein at least one of the plurality of driven loops has a resonant frequency different from at least another one of the plurality of driven loops.

* * * * *